(12) United States Patent
Lee

(10) Patent No.: US 7,390,716 B2
(45) Date of Patent: Jun. 24, 2008

(54) METHOD OF MANUFACTURING FLASH MEMORY DEVICE

(75) Inventor: In No Lee, Kyeongki-do (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 11/583,753

(22) Filed: Oct. 18, 2006

(65) Prior Publication Data

US 2007/0184605 A1 Aug. 9, 2007

(30) Foreign Application Priority Data

Feb. 7, 2006 (KR) .................... 10-2006-0011546

(51) Int. Cl.
*H01L 21/336* (2006.01)

(52) U.S. Cl. .............. 438/257; 438/264; 438/424; 257/315; 257/E21.682; 257/E27.103

(58) Field of Classification Search .......... 438/257, 438/242; 428/221–224, 269, 359–361, 424–438; 257/314–320, E21.628, E21.681, E21.682
See application file for complete search history.

(56) References Cited

U.S. PATENT DOCUMENTS

| | | | |
|---|---|---|---|
| 6,569,735 B2 * | 5/2003 | Su | 438/257 |
| 6,921,723 B1 * | 7/2005 | Lee et al. | 438/710 |
| 2002/0192976 A1 * | 12/2002 | Trapp et al. | 438/723 |
| 2004/0147090 A1 * | 7/2004 | Kim et al. | 438/424 |
| 2004/0248414 A1 * | 12/2004 | Tsai et al. | 438/689 |
| 2004/0266135 A1 * | 12/2004 | Dong et al. | 438/435 |
| 2005/0047261 A1 * | 3/2005 | Kai et al. | 365/232 |
| 2005/0151184 A1 * | 7/2005 | Lee et al. | 257/314 |
| 2006/0141794 A1 * | 6/2006 | Laermer et al. | 438/706 |

FOREIGN PATENT DOCUMENTS

| | | |
|---|---|---|
| KR | 1020010076846 A | 8/2001 |
| KR | 1020050066875 A | 6/2005 |
| KR | 1020050070862 A | 7/2005 |

* cited by examiner

*Primary Examiner*—Brook Kebede
*Assistant Examiner*—Shaka Scarlett
(74) *Attorney, Agent, or Firm*—Marshall, Gerstein & Borun LLP

(57) ABSTRACT

A method of manufacturing a flash memory device. An etch process for controlling the effective field height of isolation layers is performed using a dry etch process on condition that an excessive amount of polymer is generated, thus forming first spacers on sidewalls of a floating gate pattern. The first spacers serve as an etch barrier layer when the isolation layers of regions exposed when a control gate and a floating gate are formed subsequently are etched, so that a second spacer is formed on sidewalls of the semiconductor substrate of an active region. Accordingly, exposure and damage of the sidewalls of the semiconductor substrate can be prevented and the reliability of devices can be improved.

16 Claims, 4 Drawing Sheets

METHOD OF MANUFACTURING FLASH MEMORY DEVICE

BACKGROUND

1. Field of the Invention

The invention relates in general to a method of manufacturing a flash memory device and, more particularly, to a method of manufacturing a flash memory device, wherein damage to the sidewalls of a semiconductor substrate of a region exposed when a control gate and a floating gate are formed can be prevented.

2. Discussion of Related Art

A NAND flash memory device performs data program by injecting electrons into the floating gate by Fowler-Nordheim tunneling (FN). The NAND flash memory device provides a large capacity and a high level of integration.

The NAND flash memory device includes a number of cell blocks. Each cell block includes a number of cell strings in which a number of cells for storing data are connected in series to form one string, and a drain select transistor and a source select transistor formed between the cell string and the drain, and the cell string and the source, respectively.

The cell of the NAND flash memory device is formed by forming an isolation layers on a predetermined region of a semiconductor substrate, forming a gate in which a tunnel oxide layer, a floating gate, a dielectric layer, and a control gate are laminated on a predetermined region of the semiconductor substrate, and forming a junction at both sides of the gate.

In a NAND flash memory device of 60 nm or less, however, a method of forming high a conductive layer for a floating gate and performing a trench etch process for forming an isolation layers simultaneously with an etch process of the conductive layer is used in order to secure the overlap margin of the floating gate and the active region at the same time and to prevent a thinning phenomenon of the tunnel oxide layer.

In the case where the method is used, a process of controlling the EFH (effective field oxide height) by etching the isolation layers to a predetermined depth using a wet etch process must be implemented subsequently in order to increase the junction area of the dielectric layer and the floating gate. However, as the conductive layer for the floating gate of a region exposed at the time of the formation of the control gate and the floating gate subsequently is etched, the isolation layers is further etched.

Accordingly, the isolation layers is formed lower in depth than a surface of the semiconductor substrate. If the isolation layers is formed lower in depth than the surface of the semiconductor substrate as described above, the sidewalls of the semiconductor substrate are exposed. As a result, the exposed portions of the semiconductor substrate are damaged in a subsequent process, leading to fatal damage to the device.

SUMMARY OF THE INVENTION

In one embodiment, the invention relates to a method of manufacturing a flash memory device, wherein sidewalls of a semiconductor substrate of an active region are prevented from being exposed due to an etched isolation layers of a region exposed when a control gate and a floating gate are formed.

Another embodiment of the invention relates to a method of manufacturing a flash memory device, wherein a spacer is formed by performing an etch process of an isolation layers using a dry etch process on condition that an excessive amount of polymer is generated, wherein the spacer is formed on sidewalls of a semiconductor substrate of an active region when the isolation layers of a region exposed by the control gate using the spacer is etched whereby the sidewalls of the semiconductor substrate can be prevented from being exposed.

According to one aspect, the invention provides a method of manufacturing a flash memory device, including the steps of forming a floating gate pattern in which a tunnel oxide layer and a first conductive layer are laminated in a first region of a semiconductor substrate, and forming isolation layers in a second region of the semiconductor substrate; etching the isolation layers to a predetermined thickness by a dry etch process, thus forming first spacers on sidewalls of the floating gate pattern; and forming a dielectric layer, a second conductive layer, and a hard mask layer on the entire surface, patterning the hard mask layer, the second conductive layer, and the dielectric layer to form a control gate, and etching the floating gate pattern using the control gate as a mask, forming a floating gate. While the floating gate pattern is etched to expose the semiconductor substrate, a second spacer is formed on lateral faces of the semiconductor substrate as some of the isolation layers are etched.

The floating gate pattern and the isolation layers may preferably be formed by the steps of sequentially forming the tunnel oxide layer, the first conductive layer, a buffer oxide layer, and a nitride layer on the semiconductor substrate; etching predetermined regions of the nitride layer to the tunnel oxide layer by a photolithography process employing an isolation mask, thus forming the floating gate pattern, and then etching the semiconductor substrate to a predetermined depth, thus forming a trench; forming an insulating layer on the entire surface so that the trench is gap filled; and polishing the insulating layer so that the nitride layer is exposed, forming the isolation layers.

The insulating layer may preferably be formed by using a HDP oxide layer, or by laminating a HDP oxide layer and a SOD layer.

The dry etch process may be performed on condition that an excessive amount of polymer is generated.

The dry etch process may preferably be performed using a gas, such as $CH_2F_2$, $C_4F_8$, $C_5F_8$, $C_4F_6$, Ar or $O_2$, for example. Preferably, the dry etch process may be performed using a mixed gas of $C_2H_2F_2$, $C_4F_6$, Ar, and $O_2$, a mixed gas of $C_2H_2F_2$, $C_4F_8$, Ar and $O_2$, or a mixed gas of $C_2H_2F_2$, $C_5F_8$, Ar, and $O_2$.

The dry etch process may preferably be performed using ICP type equipment or MERIE (magnetic enhanced reactive ion) equipment. The dry etch process employing the ICP type equipment may be performed by applying a pressure of 3 mTorr to 100 mTorr and source and bias power of 500 W to 1000 W. The dry etch process employing the MERIE equipment may preferably be performed by applying a pressure of 10 mTorr to 200 mTorr and source and bias power of 100 W to 1000 W.

The dielectric layer may preferably be formed using an ONO structure or a high dielectric material. The high dielectric material may include materials, such as $Al_2O_3$, $HfO_2$, $ZrO_2$, SiON, $La_2O_3$, $Y_2O_3$, $TiO_2$, $CeO_2$, $N_2O_3$, $Ta_2O_5$, $BaTiO_3$, $SrTiO_3$, BST, and PZT, and mixed oxide, such as $Hf_xAl_yO_z$, $Zr_xAl_yO_z$, $HfSiO_4$, and $ZrSiO_4$, for example.

The hard mask layer may preferably be formed using an oxide layer or amorphous carbon.

According to another aspect, the invention provides a method of manufacturing a flash memory device, including the steps of laminating a tunnel oxide layer and a first conductive layer in a first region of a semiconductor substrate, and forming isolation layers in a second region of the semiconductor substrate; etching the isolation layers to a predetermined thickness by a dry etch process, forming first spacers on sidewalls of the first conductive layer; forming a second conductive layer on the first conductive layer in such a way to partially overlap with the isolation layers, forming a floating gate pattern; forming a dielectric layer, a third conductive layer, and a hard mask layer on the entire surface, patterning the hard mask layer, the third conductive layer, and the dielectric layer to form a control gate, and etching the floating gate pattern using the control gate as a mask, forming a floating gate. While the floating gate pattern is etched to expose the semiconductor substrate, a second spacer is formed on lateral faces of the semiconductor substrate as some of the isolation layers are etched.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

Figure 1:
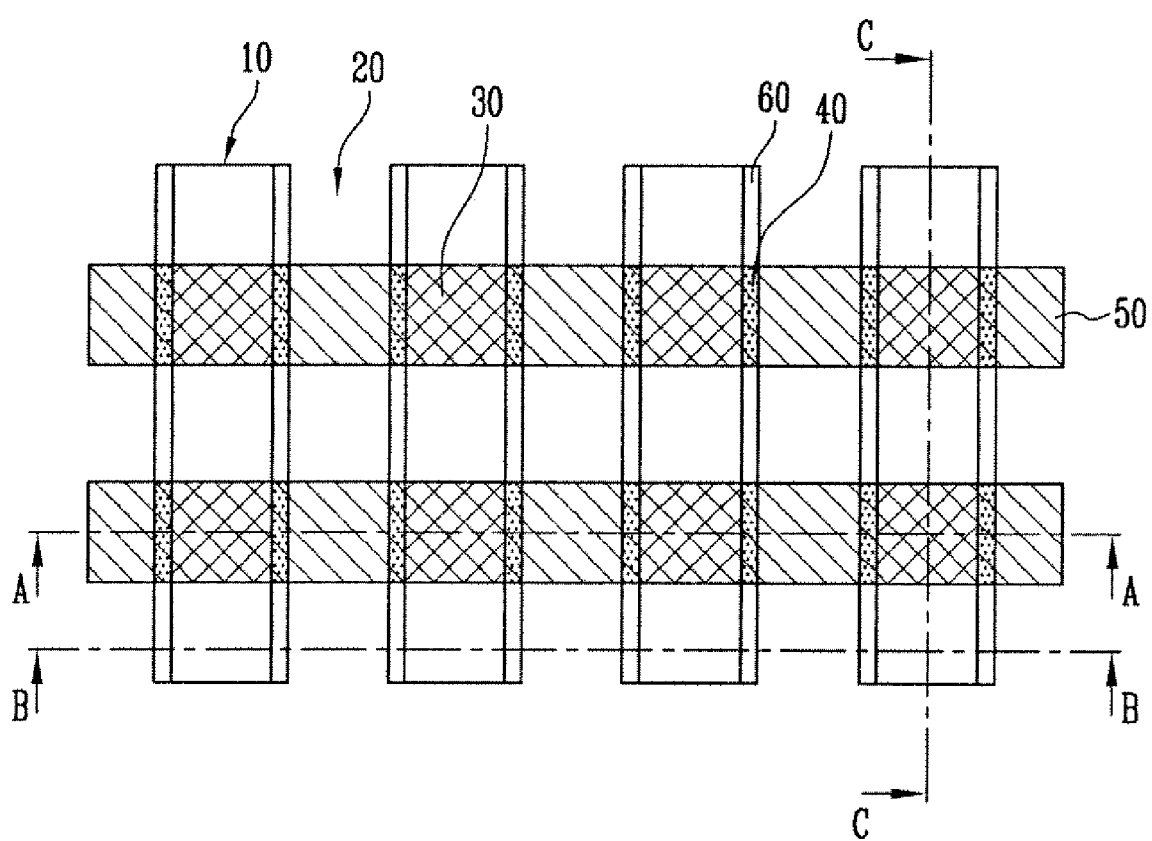
FIG. 1 is a layout diagram of a flash memory device according to an embodiment of the invention.
Figure 2A:
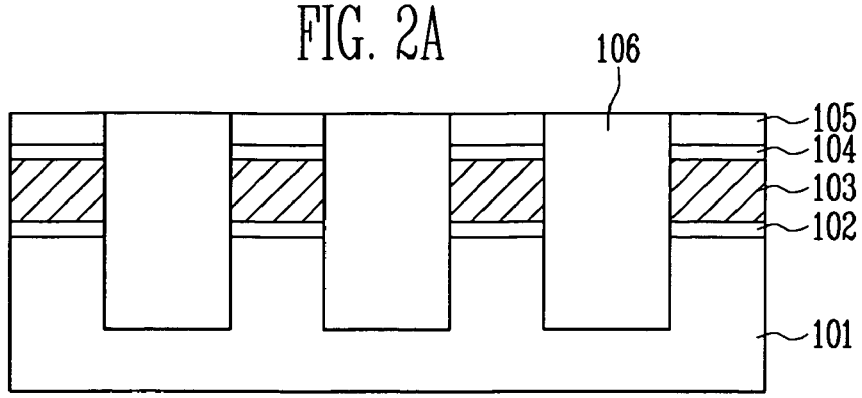
FIGS. 2A to 2D are cross-sectional views of the flash memory device taken along line A-A in FIG. 1 in order to explain a method of manufacturing a flash memory device according to an embodiment of the invention.
Figure 2B:
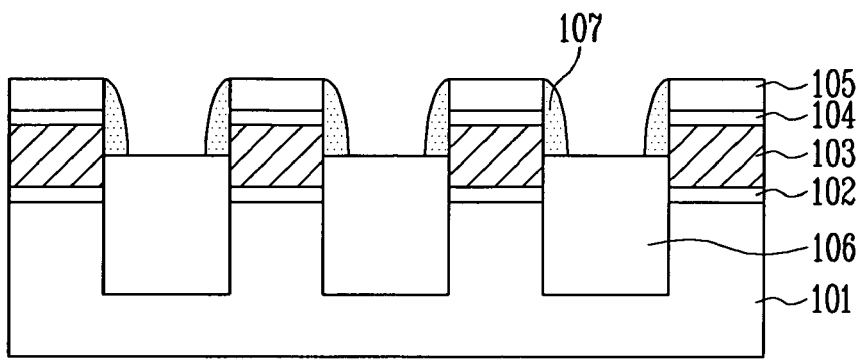
Figure 2C:
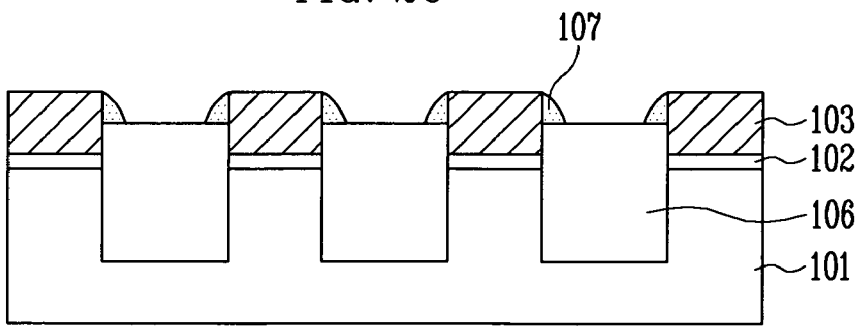
Figure 2D:
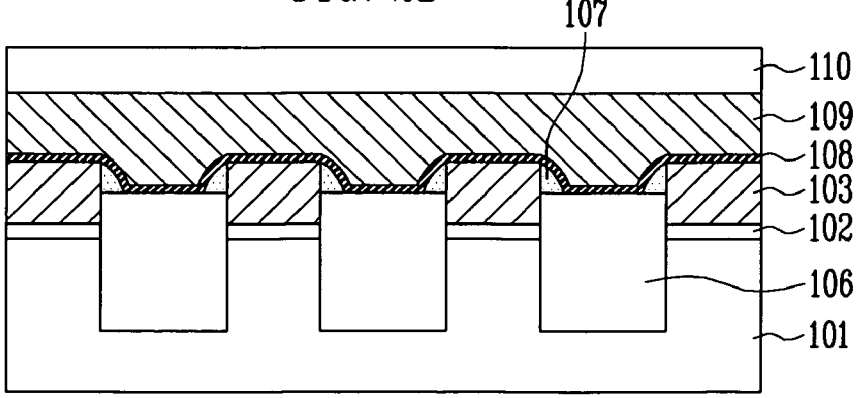
Figure 3:
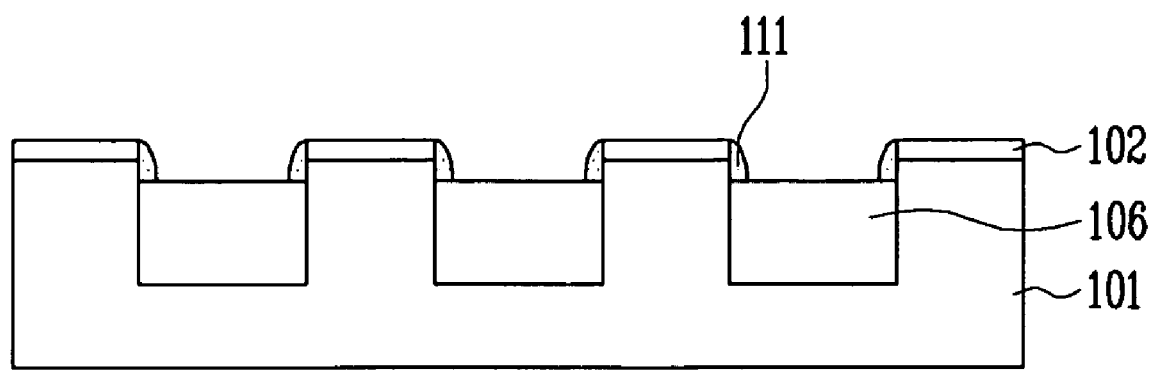
FIG. 3 is a cross-sectional view of the flash memory device taken along line B-B in FIG. 1 after a final process in order to explain a method of manufacturing a flash memory device according to an embodiment of the invention.

FIG. 1 is a layout diagram of a flash memory device according to an embodiment of the invention, FIGS. 2A to 2D are cross-sectional views of the flash memory device taken along line A-A in FIG. 1 in order to explain a method of manufacturing a flash memory device according to an embodiment of the invention, and FIG. 3 is a cross-sectional view of the flash memory device taken along line B-B in FIG. 1 after a final process in order to explain a method of manufacturing a flash memory device according to an embodiment of the invention.

Referring to FIGS. 1 and 2A, a tunnel oxide layer 102, a first conductive layer 103, a buffer oxide layer 104, and a nitride layer 105 are sequentially formed on a semiconductor substrate 101. The first conductive layer 103 may preferably be formed using a polysilicon layer to a thickness of 500 Å to 2000 Å. It is preferred that the first conductive layer 103 is formed by laminating an undoped polysilicon layer and a doped polysilicon layer.

To define active regions 10 and field regions 20, the nitride layer 105 is patterned by a photolithography process employing an isolation mask. The buffer oxide layer 104, the first conductive layer 103, the tunnel oxide layer 102, and the semiconductor substrate 101 are etched to a predetermined depth using the patterned nitride layer 105 as an etch mask, thereby forming trenches.

The active regions 10 and the field regions 20 are defined in parallel by the trenches formed in the field region 20. In the active regions 10, the first conductive layer 103 are patterned and floating gate patterns are defined.

After an insulating layer is formed on the entire surface so that the trenches are gap filled, a CMP (chemical mechanical polishing) process is performed to form isolation layers 106. The isolation layers 106 may be formed using a HDP oxide layer or may be formed by laminating a HDP oxide layer and a SOD layer, for example.

Referring to FIGS. 1 and 2B, in order to control the EFH (effective field height) of the isolation layers 106, the isolation layers 106 are etched to a predetermined thickness by a dry etch process with a good etch selectivity against the nitride layer 105. The dry etch process may be performed using a gas, such as $CH_2F_2$, $C_4F_8$, $C_5F_8$, $C_4F_6$, Ar, or $O_2$, for example. For example, the dry etch process may be performed using a mixed gas of $C_2H_2F_2$, $C_4F_6$, Ar, and $O_2$, a mixed gas of $C_2H_2F_2$, $C_4F_8$, Ar, and $O_2$, or a mixed gas of $C_2H_2F_2$, $C_5F_8$, Ar, and $O_2$.

If the isolation layers 106 are dry etched using the gas, the etch loss of the nitride layer 105 can be minimized. Furthermore, an excessive amount of polymer is generated during the etch process. The excessive amount of polymer serves as an etch barrier layer, thereby hindering some etching of the isolation layers 106. As a result, first spacers 40 and 107 are formed on the sidewalls of the floating gate pattern.

Meanwhile, the etch process may be performed using ICP type equipment or MERIE equipment. In the case where the ICP type equipment is used, the etch process may preferably be performed by applying a pressure of 3 mTorr to 100 mTorr and source and bias power of 500 W to 1000 W. In the case where the MERIE equipment is used, the etch process may preferably be performed by applying a pressure of 10 mTorr to 200 mTorr and source and bias power of 100 W to 1000 W.

Referring to FIG. 2C, the nitride layer 105 is stripped by a wet etch process preferably employing phosphoric acid ($H_3PO_4$). The buffer oxide layer 104 serves to protect the first conductive layer 103 when stripping the nitride layer 105. A cleaning process is then performed. Accordingly, the buffer oxide layer 104 is fully stripped and the isolation layers 106 are partially stripped, so that the EFH of the isolation layers 106 is finally controlled. The first spacers 40 and 107 formed on the sidewalls of the floating gate pattern are partially stripped, but remain intact.

Figure 4:
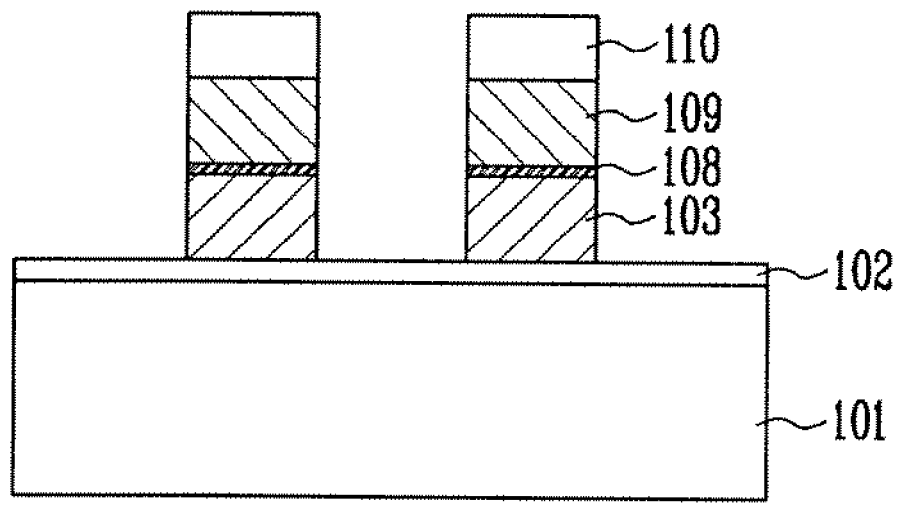
FIG. 4 is a cross-sectional view of the flash memory device taken along line C-C in FIG. 1 after a final process in order to explain a method of manufacturing a flash memory device according to an embodiment of the invention.

Referring to FIGS. 2D and 4, a dielectric layer 108, a second conductive layer 109, and a hard mask layer 110 are formed on the entire surface. The dielectric layer 108 may be formed using a film of an ONO structure or a high dielectric material. The high dielectric material may preferably include materials, such as $Al_2O_3$, $HfO_2$, $ZrO_2$, SiON, $La_2O_3$, $Y_2O_3$, $TiO_2$, $CeO_2$, $N_2O_3$, $Ta_2O_5$, $BaTiO_3$, $SrTiO_3$, BST, and PZT, and mixed oxide, such as HfxAlyOz, ZrxAlyOz, $HfSiO_4$, and $ZrSiO_4$, for example.

Meanwhile, the second conductive layer 109 may be formed using a single layer of a polysilicon layer or a stack structure of a polysilicon layer and a tungsten silicide layer. Furthermore, the hard mask layer 110 may be formed using an oxide layer, amorphous carbon or the like.

The hard mask layer 110 is patterned by a photolithography process employing a control gate mask. The second conductive layer 109 is etched to form control gates 50 in a direction vertical to the isolation layers 106. Predetermined regions of the dielectric layer 107 to the tunnel oxide layer 102 are etched by an etch process, thus forming floating gates 30.

Referring to FIGS. 1 and 3, the isolation layers 106 are partially etched in the regions exposed at the time of the etch process for forming the floating gate 30 and the control gate 50. Accordingly, a height of the isolation layers 106 becomes lower than that of the semiconductor substrate 101. However, the first spacers 40 and 107 formed on the sidewalls of the floating gate pattern serve as etch barrier layers, so that the isolation layers 106 below the first spacers 40 and 107 are not etched. Therefore, second spacers 60 and 111 are formed on the sidewalls of the exposed semiconductor substrate 101. Consequently, although the isolation layers 106 are etched lower than the surface height of the semiconductor substrate 101, the sidewalls of the semiconductor substrate 101 can be protected by the second spacers 60 and 111.

Meanwhile, in the above embodiment, the process of forming the conductive layer for the floating gate using a single layer has been described. However, the invention is not limited to the above embodiment, but may be applied to other processes in which the lateral faces of the semiconductor substrate are exposed since the isolation layers of the region exposed when the control gate and the floating gate are formed are etched.

For example, the invention may be applied to a SA-STI (self-aligned shallow trench isolation) process of forming a floating gate using a stack structure of first and second conductive layers. The STI process will be described in short below.

Figure 5:
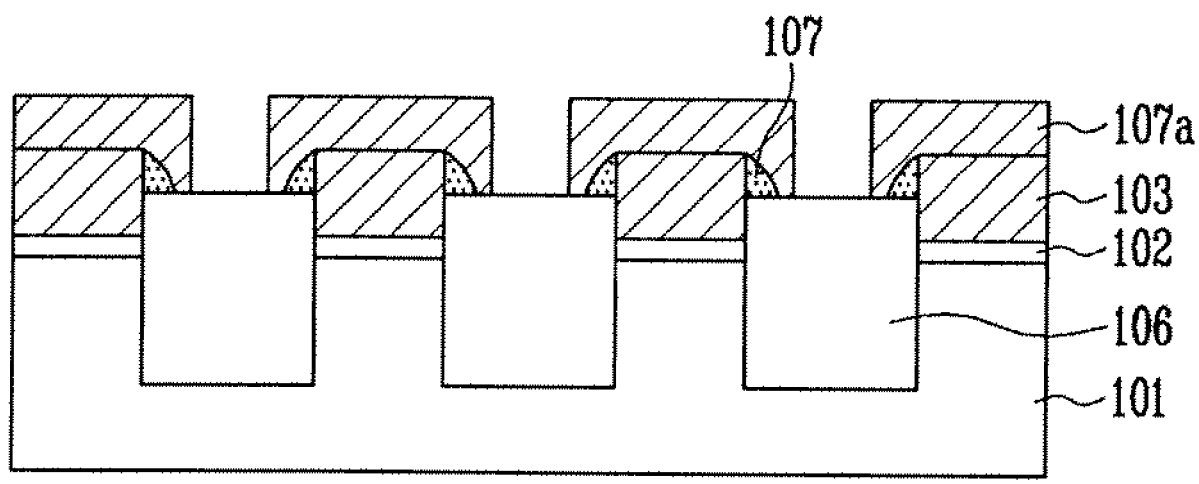
FIG. 5 is a cross-sectional view of the flash memory device taken along line A-A in FIG. 1 in order to explain a method of manufacturing a flash memory device according to another embodiment of the invention.

A Referring to FIG. 5, a tunnel oxide layer 102, a first conductive layer 103, a buffer oxide layer (not shown), and a nitride layer (not shown) are formed on a semiconductor substrate 101. Predetermined regions of the tunnel oxide layer 102, the first conductive layer 103, the buffer oxide layer, and the nitride layer, and some of the semiconductor substrate 101 are etched to a predetermined depth, thus forming trenches.

The trenches are gap-filled to form isolation layers 106. A process of etching the isolation layers 106 to a predetermined thickness is performed using a dry etch process in which an excessive amount of polymer is generated, thereby forming first spacers 107 on the sidewalls of the first conductive layer 103.

After the nitride layer and the buffer oxide layer are stripped, a second conductive layer 107a is formed in such a way to overlap with the isolation layers 106, so that a floating gate pattern of first and second conductive layers 107, 107a is formed. Subsequent processes are the same as those that have been described with reference to the drawings. The first conductive layer 107 may preferably be formed to a thickness of 100 Å to 1000 Å and the second conductive layer 107a may preferably be formed to a thickness of 200 Å to 1500 Å.

As described above, according to the invention, first spacers are formed on the sidewalls of a floating gate pattern by performing an etch process for controlling the EFH of isolation layers using a dry etch process in which an excessive amount of polymer is generated. The first spacers serve as the etch barrier layers when the isolation layers of regions exposed when the control gate and the floating gate are formed subsequently, so that second spacers are formed on lateral faces of the semiconductor substrate of the active region. Accordingly, exposure and damage of the sidewalls of the semiconductor substrate can be prevented and the reliability of devices can be improved.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of manufacturing a flash memory device, the method comprising:
    forming a floating gate pattern in which a tunnel oxide layer and a first conductive layer are laminated in a first region of a semiconductor substrate, and forming isolation layers in a second region of the semiconductor substrate;
    etching the isolation layers to a predetermined thickness by a dry etch process, thus forming first spacers on sidewalls of the floating gate pattern using a polymer generated while the isolation layers are etched; and
    forming a dielectric layer, a second conductive layer, and a hard mask layer on the entire surface, patterning the hard mask layer, the second conductive layer, and the dielectric layer to form a control gate, and etching the floating gate pattern using the control gate as a mask, forming a floating gate,
    wherein while the floating gate pattern is etched to expose the semiconductor substrate, a second spacer is formed on lateral faces of the semiconductor substrate as some of the isolation layers are etched.

2. The method of claim 1, wherein the floating gate pattern and the isolation layers are formed by:
    sequentially forming the tunnel oxide layer, the first conductive layer, a buffer oxide layer, and a nitride layer on the semiconductor substrate;
    etching predetermined regions of the nitride layer to the tunnel oxide layer by a photolithography process employing an isolation mask, thus forming the floating gate pattern, and then etching the semiconductor substrate to a predetermined depth, thus forming a trench;
    forming an insulating layer on the entire surface so that the trench is gap filled; and
    polishing the insulating layer so that the nitride layer is exposed, forming the isolation layers.

3. The method of claim 2, comprising forming the insulating layer by using a high density plasma (HDP) oxide layer, or by laminating a high-density plasma (HDP) oxide layer and a Spin-on-Dielectric (SOD) layer.

4. The method of claim 1, comprising performing the dry etch process on condition that an excessive amount of polymer is generated.

5. The method of claim 1, comprising performing the dry etch process using a gas.

6. The method of claim 5, wherein the gas is selected from the group comprising of $CH_2F_2$, $C_4F_8$, $C_5F_8$, $C_4F_6$, Ar or $O_2$.

7. The method of claim 1, comprising performing the dry etch process using a mixed gas of $C_2H_2F_2$, $C_4F_6$, Ar, and $O_2$.

8. The method of claim 1, comprising performing the dry etch process using a mixed gas of $C_2H_2F_2$, $C_4F_8$, Ar, and $O_2$.

9. The method of claim 1, comprising performing the dry etch process using a mixed gas of $C_2H_2F_2$, $C_5F_8$, Ar, and $O_2$.

10. The method of claim 1, comprising performing the dry etch process using ICP (Inductively Coupled Plasma) type equipment or MERIE (Magnetically Enhanced Reactive Ion Etching) equipment.

11. The method of claim 10, comprising performing the dry etch process employing the ICP type equipment by applying a pressure of 3 mTorr to 100 mTorr and source and bias power of 500 W to 1000 W.

12. The method of claim 10, comprising performing the dry etch process employing the MERIE equipment by applying a pressure of 10 mTorr to 200 mTorr and source and bias power of 100 W to 1000 W.

13. The method of claim 1, comprising forming the dielectric layer using an (oxide-nitride-oxide) ONO structure or a high dielectric material.

14. The method of claim 13, wherein the high dielectric material includes materials selected from the group consisting of $Al_2O_3$, $HfO_2$, $ZrO_2$, SiON, $La_2O_3$, $Y_2O_3$, $TiO_2$, $CeO_2$, $N_2O_3$, $Ta_2O_5$, $BaTiO_3$, $SrTiO_3$, BST, and PZT, or mixed oxide, selected from the group consisting of $Hf_xAl_yO_z$, $Zr_xAl_yO_z$, $HfSiO_4$, and $ZrSiO_4$.

15. The method of claim 1, comprising the hard mask layer using an oxide layer or amorphous carbon.

16. A method of manufacturing a flash memory device, the method comprising:

laminating a tunnel oxide layer and a first conductive layer in a first region of a semiconductor substrate, and forming isolation layers in a second region of the semiconductor substrate;

etching the isolation layers to a predetermined thickness by a dry etch process, thus forming first spacers on sidewalls of the first conductive layer using a polymer generated while the isolation layers are etched;

forming a second conductive layer on the first conductive layer in such a way to partially overlap with the isolation layers, forming a floating gate pattern; and forming a dielectric layer, a third conductive layer, and a hard mask layer on the entire surface, patterning the hard mask layer, the third conductive layer, and the dielectric layer to form a control gate, and etching the floating gate pattern using the control gate as a mask, forming a floating gate, wherein while the floating gate pattern is etched to expose the semiconductor substrate, a second spacer is formed on lateral faces of the semiconductor substrate as some of the isolation layers are etched.

* * * * *